(12) United States Patent
Jung et al.

(10) Patent No.: US 8,362,682 B2
(45) Date of Patent: *Jan. 29, 2013

(54) WHITE LIGHT EMITTING DIODE PACKAGE FOR INCANDESCENT COLOR

(75) Inventors: Jung Hwa Jung, Ansan-si (KR); In Kyu Park, Ansan-si (KR); Byoung Hoon Choi, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/240,558

(22) Filed: Sep. 22, 2011

(65) Prior Publication Data

US 2012/0007502 A1   Jan. 12, 2012

Related U.S. Application Data

(63) Continuation of application No. 12/415,360, filed on Mar. 31, 2009, now Pat. No. 8,044,587.

(30) Foreign Application Priority Data

Mar. 31, 2008   (KR) .................. 10-2008-0029968

(51) Int. Cl.
  *H01J 1/62*   (2006.01)
  *H01J 63/04*   (2006.01)
(52) U.S. Cl. ......... 313/498; 313/503; 313/506; 313/512
(58) Field of Classification Search .......... 313/498–512; 257/98–100
  See application file for complete search history.

(56) References Cited

U.S. PATENT DOCUMENTS

| | | | |
|---|---|---|---|
| 6,577,073 | B2 | 6/2003 | Shimizu et al. |
| 7,005,679 | B2 | 2/2006 | Tarsa et al. |
| 7,061,454 | B2 | 6/2006 | Sasuga et al. |
| 7,564,180 | B2 | 7/2009 | Brandes |
| 8,044,587 | B2 * | 10/2011 | Jung et al. ...................... 313/512 |
| 2005/0099808 | A1 | 5/2005 | Cheng et al. |
| 2005/0224828 | A1 | 10/2005 | Oon et al. |
| 2006/0067073 | A1 | 3/2006 | Ting |
| 2006/0220053 | A1 | 10/2006 | Furukawa et al. |
| 2008/0048193 | A1 | 2/2008 | Yoo et al. |
| 2008/0265269 | A1 | 10/2008 | Yoo et al. |
| 2010/0025700 | A1 | 2/2010 | Jung et al. |

OTHER PUBLICATIONS

Non-Final Office Action dated Oct. 7, 2010 in U.S. Appl. No. 12/415,360.
Final Office Action dated Apr. 15, 2011 in U.S. Appl. No. 12/415,360.
Notice of Allowance dated Aug. 9, 2011 in U.S. Appl. No. 12/415,360.

* cited by examiner

*Primary Examiner* — Anh Mai
*Assistant Examiner* — Kevin Quarterman
(74) *Attorney, Agent, or Firm* — H.C. Park & Associates, PLC

(57) ABSTRACT

The present invention relates to a white light emitting diode (LED) package that includes a blue LED chip to emit blue light; a yellow phosphor excited by the blue light and emit yellow light, the yellow light to produce a primary white light in combination with the blue light; a red LED chip to emit red light, the red light to adjust the primary white light into secondary white light of an incandescent color; and a package member comprising at least a partial transmissive part covering the blue LED chip, the red LED chip, and the yellow phosphor. The primary white light falls in a region of (0.413, 0.502), (0.335, 0.376), (0.37, 0.371), and (0.439, 0.48) based on a CIE color coordinate standard.

13 Claims, 4 Drawing Sheets

Fig. 3

White light coordinates based on CIE1931 standard

| class | x | y | color temperature | description |
|---|---|---|---|---|
| A | 0.4476 | 0.4075 | 2854K | Incandescent Light |
| B | 0.3840 | 0.3518 | 4874K | Direct Sunlight |
| C | 0.3101 | 0.3162 | 6774K | Indirect Sunlight |
| D5000 | 0.3457 | 0.3586 | 5000K | Bright Incandescent |
| D6500 | 0.3127 | 0.3297 | 6504K | "Natural Daylight |
| E | 0.3333 | 0.3333 | 5500K | Normalized Reference |

(a)

(b)

WHITE LIGHT EMITTING DIODE PACKAGE FOR INCANDESCENT COLOR

CROSS REFERENCE TO RELATED APPLICATION

This application is a continuation of U.S. patent application Ser. No. 12/415,360, filed on Mar. 31, 2009, and claims priority from and the benefit of Korean Patent Application No. 10-2008-0029968, filed on Mar. 31, 2008, both of which are hereby incorporated by reference for all purposes as if fully set forth herein.

BACKGROUND OF THE INVENTION

1. Field of the Invention

The present invention relates to a white light emitting diode (LED) package and to a white LED package that emits white light with an incandescent color.

2. Discussion of the Background

White LED packages using an LED as a white light source instead of a traditional is incandescent lamp or a fluorescent lamp have been increasingly developed. An LED package typically uses a semiconductor LED that emits light by recombination of electrons and holes at a p-n junction upon application of an electric current.

A conventional white LED package may be fabricated using trichromatic LED chips that emit red, green, and blue light. However, such an LED package may not produce uniform white light due to differences in distance between the trichromatic LED chips. Further, a white LED package may be developed that produces white light via a combination of a blue LED chip and a yellow phosphor. This conventional LED package has a simple circuit configuration and may be cost effective, but may exhibit low color reproducibility due to low light intensity at long wavelengths.

Numerous studies have been carried out to develop an LED package that emits optimal white light in terms of color uniformity and color reproducibility. An incandescent lamp is well known as a light source which is close to a Plankian radiator. The incandescent lamp emits a warm white light at a temperature of about 2854 K based on the CIE1931 standard, which provides a warm and comfortable atmosphere and an enhanced aesthetic appeal of a colored object. For that reason, there is a need in the LED field to develop an LED package emitting white light more similar to the incandescent lamp.

SUMMARY OF THE INVENTION

The present invention relates to a white LED package that emits white light with incandescent color by adjusting white light in an optimum color coordinate region using a red LED chip, a blue LED chip and a yellow phosphor.

Additional features of the invention will be set forth in the description which follows, and in part will be apparent from the description, or may be learned by practice of the invention.

The present invention discloses a white LED package that includes a blue LED chip to emit blue light; a yellow phosphor excited by the blue light to emit yellow light; and a red LED chip to emit red light. The yellow light produces primary white light in combination with the blue light, and the red LED chip is adapted to emit red light, the red light to adjust the primary white light into secondary white light of an incandescent color. Further, a package member is at least partially formed with a transmissive part which covers the blue LED chip, the red LED chip, and the yellow phosphor. The primary white light falls in a region of (0.413, 0.502), (0.335, 0.376), (0.37, 0.371), and (0.439, 0.48) based on a CIE color coordinate standard.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 3 is a table of CIE1931 standard light.

DETAILED DESCRIPTION OF THE ILLUSTRATED EMBODIMENTS

Figure 1:
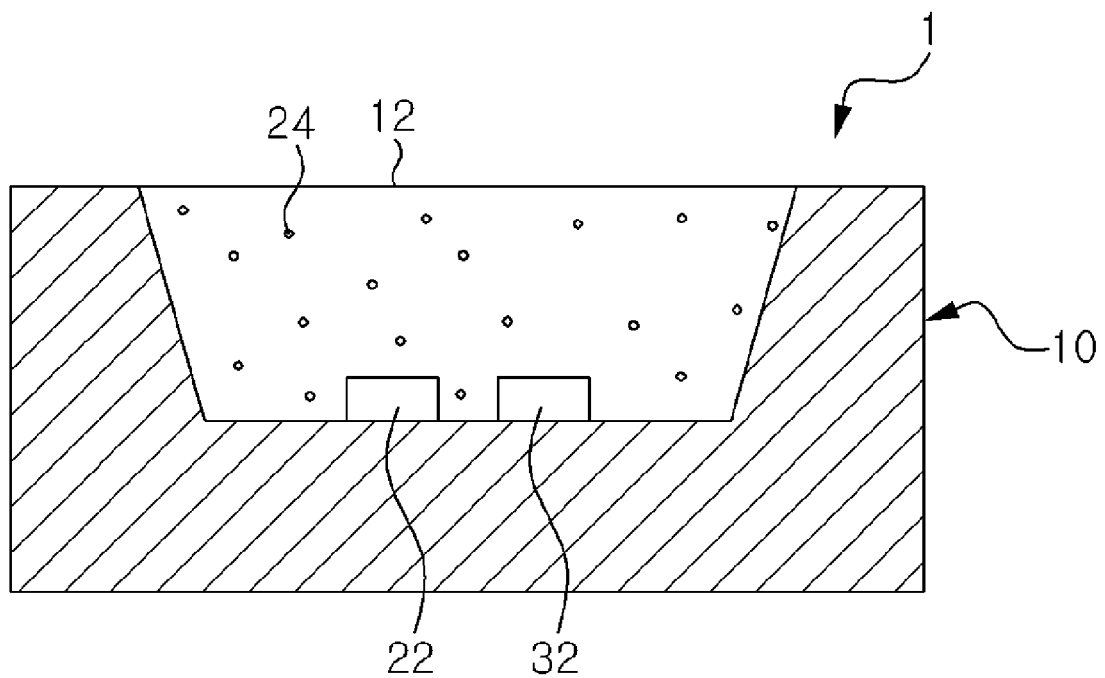
FIG. 1 is a view of a white light emitting diode (LED) package according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 shows a white LED package according to an exemplary embodiment of the present invention.

The white LED package 1 includes a package member 10 that includes a transmissive part 12. A blue LED chip 22, a red LED chip 32, and yellow phosphors 24 are located within the package member 10, particularly inside the transmissive part 12. Thus, the transmissive part 12 entirely covers the blue LED chip 22, the red LED chip 32, and the yellow phosphors 24.

The package member 10 includes lead terminals (not shown) to apply electric power to the blue LED chip 22 and the red LED chip 32. The blue and red LED chips 22 and 32 emit blue and red light, respectively, when power is applied thereto through the lead terminals. It should be noted that, although a single blue LED chip 22 and a single red LED chip 32 are shown in FIG. 1, the present invention is not limited thereto.

The transmissive part 12 is a molding member that may be formed by curing liquid resin placed in a cavity of the package member 10. Alternatively, the transmissive part 12 may include a lens, which is made of glass, transmissive plastic and the like, to cover an upper end of the cavity. An air or gas layer may be interposed between the lens and the upper end of the cavity. In the present exemplary embodiment, the package member 10 has a reflector structure including a transmissive part and a non-transmissive part. Alternatively, the package s member 10 may include a transmissive part that is formed from a molded transmissive resin. In the present exemplary embodiment, the transmissive part 12 is made of a molding member that contains the yellow phosphors 24.

The yellow phosphors 24 are excited by blue light from the blue LED chip 22 to emit yellow light. Then, primary white light is obtained by a combination of blue light emitted from the blue LED chip 22 and yellow light emitted from the yellow phosphors 24. The primary white light is defined by adjustment of the blue LED chip 22 and the yellow phosphors 24 and falls in a region A of (0.413, 0.502), (0.335, 0.376), (0.37, 0.371) and (0.439, 0.48) in a CIE1931 color coordinate graph shown in FIG. 2. Without other light sources, the blue LED chip 22 and the yellow phosphors 24 produce the primary white light that is in the region A. The adjustment is of the blue LED chip 22 and the yellow phosphors 24 to obtain the primary white light may be accomplished through simulation tests or repeated experiments.

The red LED chip 32 adjusts the primary white light using red light emitted therefrom, to produce secondary white light of an incandescent color similar to an incandescent lamp, which is a light source substantially similar to a black body. The secondary white light has a region B shown in FIG. 2. A black body, i.e., a Plankian radiator, changes its color along a predetermined locus, which is referred to as a Plankian locus, in color coordinates as temperatures increase. Referring to FIG. 3, incandescent light as one CIE standard light has a color temperature of around 2854 K on a Plankian locus and exists around a color coordinate (0.4476, 0.4075). The region B shown in FIG. 2 is in the vicinity of the color coordinate (0.4476, 0.4075), and thus can be substantially considered a color coordinate region of incandescent color.

Figure 2:
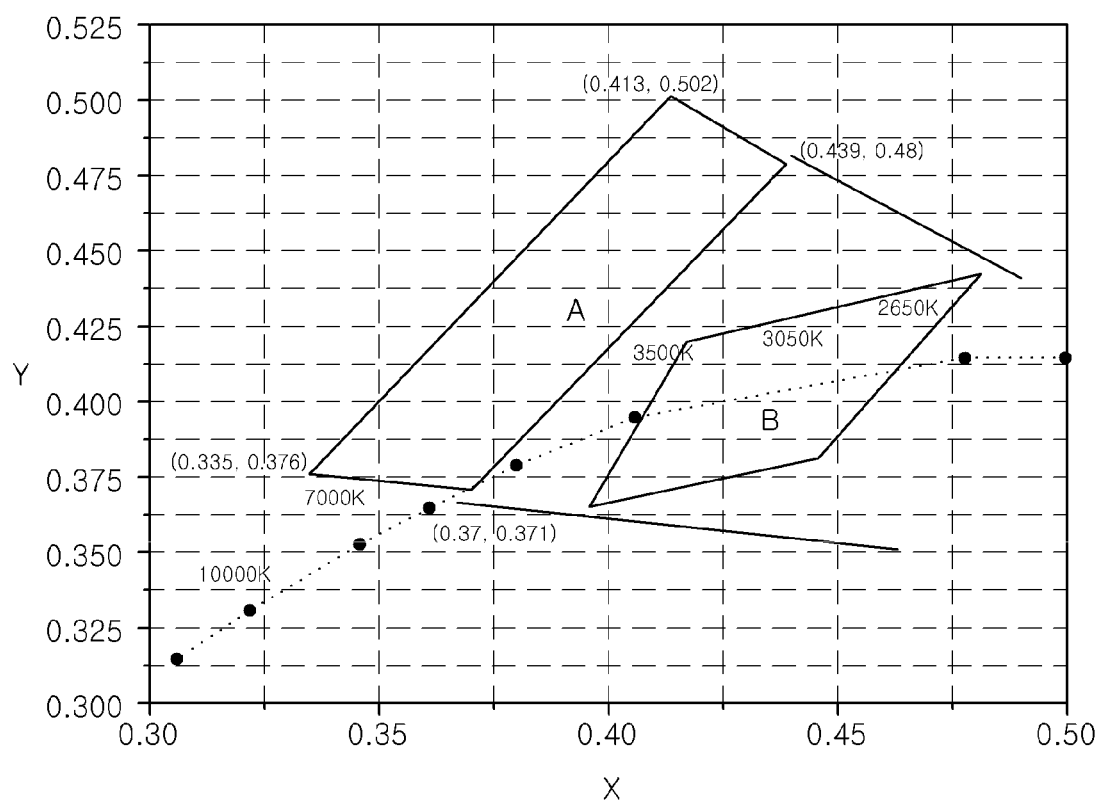
FIG. 2 is a CIE-color coordinate graph showing white light emission of the white LED package of FIG. 1 based on the CIE1931 color coordinate standard.

In the color coordinate graph of FIG. 2, it should be noted that, if light produced by the combination of the blue LED chip 22 and the yellow phosphors 24 is outside the region A of the primary white light, it may be difficult to produce secondary white light that falls in the secondary white light region B of an incandescent color or a similar color thereto despite the adjustment of the red LED chip 32.

To produce the primary white light, the blue LED chip 22 may emit blue light having a wavelength of 450 to 470 nm, and the yellow phosphor 24 may emit yellow light having a wavelength of 540 to 565 nm. To produce the secondary white light from the primary white light, the red LED chip 32 may emit red light having a wavelength of 600 to 630 nm.

Figure 4:
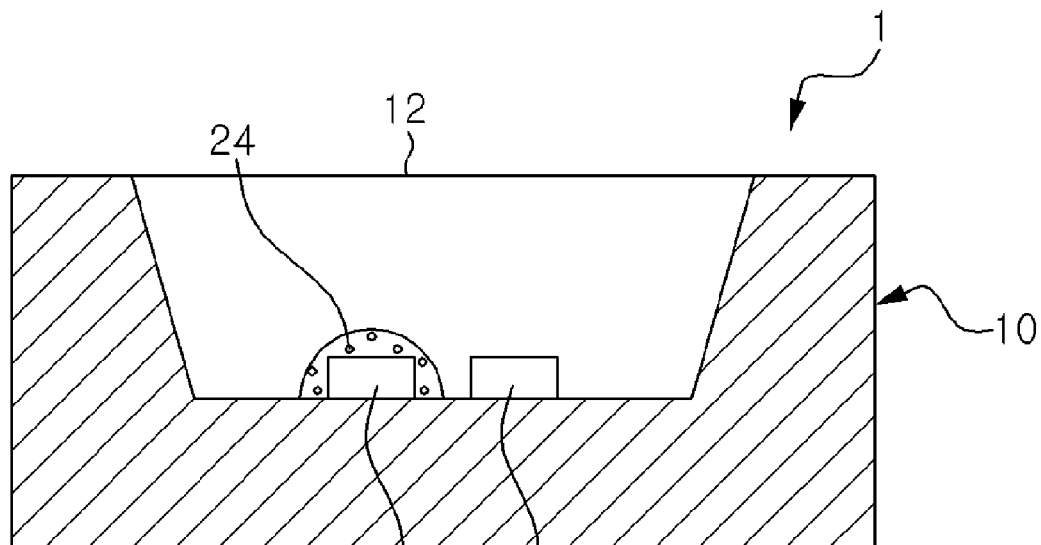
FIG. 4(a) shows a white LED according to an exemplary embodiment of the present invention.
FIG. 4(b) shows a white LED according to an exemplary embodiment of the present invention.
Figure 4:
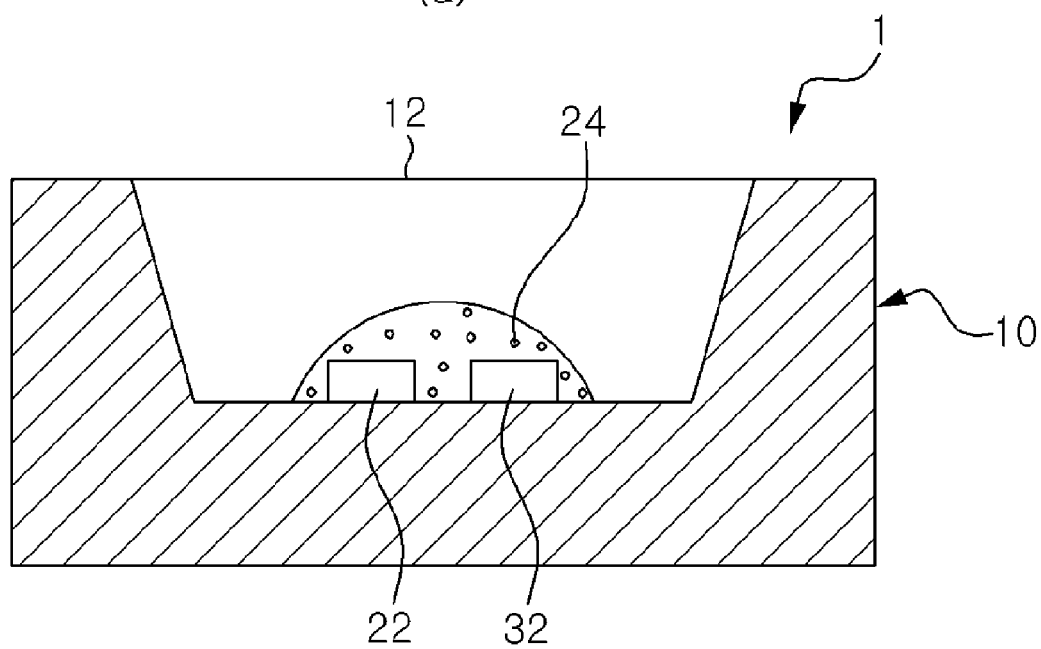

In FIG. 1, the yellow phosphors 24 are shown as widely distributed in the transmissive part 12 that is a part of the package member 10 encapsulating the blue LED chip 22 is and the red LED chip 32. However, as shown in FIG. 4(a) and FIG. 4(b), the yellow phosphors 24 may be partially formed in the transmissive part 12 to cover at least the blue LED chip 22. This may be achieved by dotting a liquid resin containing yellow phosphors on the blue LED chip 22 and/or the red LED chip 32, or coating the yellow phosphors on the blue LED chip 22 and/or the red LED chip 32 by electrophoresis, followed by forming an encapsulating material in the transmissive part 12.

Referring to FIG. 4(a), the yellow phosphors 24 only cover the blue LED chip 22. Thus, the yellow phosphors 24 can be placed outside paths of light emitted from the red LED chip 32. In the present exemplary embodiment, light loss caused by interaction between the yellow phosphors 24 and light emitted from the red LED chip 32 may therefore be avoided.

As described above, according to an exemplary embodiment of the present invention, the white LED package can provide a warm and comfortable atmosphere by a simple combination of a blue LED chip, a yellow phosphor, and a red LED chip. The white LED package can produce white light which is close to an incandescent color to enhance aesthetic appearance of a colored object, and has good color reproducibility. Further, since the red LED chip is used to adjust white light to be close to an incandescent color, the intensity of light emitted from the white LED package may be increased compared with a white LED package that uses a red phosphor.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A white light emitting diode (LED) package, comprising:
    a first light source to emit blue light;
    a phosphor to be excited by the blue light and emit light, the light to produce primary white light in combination with the blue light; and,
    a second light source to emit red light, the red light to adjust the primary white light into secondary white light comprising an incandescent color; wherein,
    the primary white light falls in a primary white light region of (0.413, 0.502), (0.335, 0.376), (0.37, 0.371), and (0.439, 0.48), based on a CIE color coordinate standard,
    the secondary white light falls in a secondary white light region on a CIE color coordinate standard, and the secondary white light region is disposed at the lower right side of the primary white light region, on a CIE color coordinate graph.

2. The white LED package of to claim 1, wherein the secondary white light region is outside of the primary white light region, on a CIE color coordinate graph.

3. The white LED package of to claim 1, wherein the blue light emitted from the first light source has a wavelength of from 450 to 470 nm.

4. The white LED package of to claim 3, wherein the first light source comprises a blue LED chip.

5. The white LED package of claim 1, wherein the light emitted from the phosphor has a wavelength of from 540 to 565 nm.

6. The white LED package of claim 1, wherein the red light emitted from the second light source has a wavelength of from 600 to 630 nm.

7. The white LED package of claim 6, wherein the second light source comprises a red LED chip.

8. The white LED package of claim 1, wherein the blue light from the first light source has a wavelength of from 450 to 470 nm, the light from the phosphor has a wavelength of from 540 to 565 nm, and the red light from the second light source has a wavelength of from 600 to 630 nm.

9. The white LED package of claim 8, wherein the phosphor is disposed outside a path of light emitted from the red LED chip.

10. A white light emitting diode (LED) package, comprising:
    a first light source to emit blue light;

a phosphor to be excited by the blue light and emit light, the light to produce primary white light in combination with the blue light; and a second light source to emit red light, the red light to adjust the primary white light into secondary white light, wherein, the primary white light falls in a primary white light region on a CIE color coordinate standard, the secondary white light falls in a secondary white light region, on a CIE color coordinate standard, and the primary white light is disposed at the upper left side of the secondary white light region, on a CIE color coordinate graph.

11. The white LED package of claim 10, wherein the secondary white light region has an incandescent color.

12. The white LED package of claim 11, wherein the incandescent color has a color temperature of around 2854 K.

13. A white light emitting diode (LED) package, comprising:

a first light source to emit blue light;

a second light source to be excited by the blue light and emit light, the light to produce primary white light in combination with the blue light from the first light source; and, a third light source to emit red light, the red light to adjust the primary white light into secondary white light having an incandescent color; wherein, the primary white light falls in a primary white light region of (0.413, 0.502), (0.335, 0.376), (0.37, 0.371), and (0.439, 0.48), based on a CIE color coordinate standard, the secondary white light falls in a secondary white light region, on a CIE color coordinate standard, and the secondary white light region is disposed at the lower right side of the primary white light region, on a CIE color coordinate graph.

* * * * *